US006643347B2

(12) United States Patent
Ohishi

(10) Patent No.: US 6,643,347 B2
(45) Date of Patent: Nov. 4, 2003

(54) CLOCK SIGNAL GENERATION APPARATUS

(75) Inventor: Takeo Ohishi, Yokohama (JP)

(73) Assignee: Victor Company (JP)

( * ) Notice: Subject to any disclaimer, the term of this patent is extended or adjusted under 35 U.S.C. 154(b) by 0 days.

(21) Appl. No.: 10/025,583

(22) Filed: Dec. 26, 2001

(65) Prior Publication Data
US 2002/0048338 A1 Apr. 25, 2002

Related U.S. Application Data

(62) Division of application No. 09/177,633, filed on Oct. 23, 1998, now Pat. No. 6,345,079.

(30) Foreign Application Priority Data

Oct. 29, 1997 (JP) .............................. 9-312590
Oct. 29, 1997 (JP) .............................. 9-312591

(51) Int. Cl.$^7$ ................................ H04L 7/00
(52) U.S. Cl. ................ 375/376; 327/156; 327/160
(58) Field of Search ..................... 375/376, 327; 327/147, 151, 156, 160; 331/11, 25; 348/525

(56) References Cited

U.S. PATENT DOCUMENTS

| 4,511,859 A | * | 4/1985 | Dombrowski ................. 331/11 |
| 4,703,520 A | * | 10/1987 | Rozanski, Jr. et al. ......... 455/75 |
| 4,996,596 A | * | 2/1991 | Hirao et al. ................. 348/542 |
| 5,299,237 A | * | 3/1994 | Head ........................... 375/376 |
| 5,424,687 A | * | 6/1995 | Fukuda ......................... 331/11 |
| 5,483,180 A | * | 1/1996 | Chai et al. .................... 326/93 |
| 5,661,440 A | * | 8/1997 | Osaka .......................... 331/16 |
| 5,671,260 A | * | 9/1997 | Yamauchi et al. ............ 573/372 |
| 5,703,511 A | * | 12/1997 | Okamoto ..................... 327/157 |
| 5,777,520 A | * | 7/1998 | Kawakami ................... 331/1 R |
| 5,841,323 A | * | 11/1998 | Fujimoto ...................... 331/11 |
| 5,847,614 A | * | 12/1998 | Gilbert et al. ................ 331/14 |
| 5,917,552 A | * | 6/1999 | Van Court ................... 348/558 |
| 5,982,239 A | * | 11/1999 | Takahashi et al. ............ 331/11 |
| 6,141,163 A | * | 10/2000 | Nakamura et al. ........... 360/51 |

FOREIGN PATENT DOCUMENTS

JP  10-11902  1/1998

OTHER PUBLICATIONS

SCR, PCR (Clock Reference Value); The latest MPEG Textbook by Point Diagrammatical Method: Aug. 1, 1994: pp. 237–238 (w/Eng. translation).

* cited by examiner

Primary Examiner—Young T. Tse
(74) Attorney, Agent, or Firm—Connolly, Bove, Lodge & Hutz LLP

(57) ABSTRACT

A clock signal generation apparatus includes a first device for extracting reference information from an input digital signal. A first oscillator generates a reference clock signal having a frequency depending on a control signal. A second oscillator generates a basic signal having a fixed frequency. A first circuit loop operates for generating a first error signal in response to the reference clock signal and the extracted reference information, and for feeding the first error signal in response to the reference clock signal and the control signal. A second device operates for enabling one of the first circuit loop and the second circuit loop and disabling the other.

6 Claims, 5 Drawing Sheets

US 6,643,347 B2

CLOCK SIGNAL GENERATION APPARATUS

CROSS REFERENCE TO RELATED APPLICATION

The present application is a divisional of U.S. patent application Ser. No. 09/177,633, filed Oct. 23, 1998, now U.S. Pat. No. 6,345,079.

BACKGROUND OF THE INVENTION

1. Field of the Invention

This invention relates to an apparatus for generating a reference clock signal from reference information in a bit stream transmitted as, for example, a sequence of MPEG2 transport packets used by digital broadcasting.

2. Description of the Related Art

In digital broadcasting, video and audio signals related to a plurality of programs are transmitted as a bit stream on a multiplexed basis. A receiver side for digital broadcasting is required to generate a reference clock signal which serves as a system clock signal.

It is known that a transmitter side for digital broadcasting generates reference information designed to enable a receiver side to generate a system clock signal, and periodically inserts the reference information into a bit stream to be transmitted. In this case, a receiver side detects the reference information in a received bit stream, and generates a system clock signal from the detected reference information. Specifically, the receiver side includes a voltage-controlled oscillator (VCO) and a phase locked loop circuit (a PLL circuit). The PLL circuit phase-locks the oscillator to the detected reference signal, thereby generating a system clock signal from the detected reference signal.

In general, there are variations in characteristic among PLL circuits. Accordingly, the above-mentioned known clock generating system requires an adjustment of an offset in a control voltage applied to the voltage-controlled oscillator. The offset adjustment increases the manufacture cost of the receiver side.

SUMMARY OF THE INVENTION

It is an object of this invention to provide a clock signal generation apparatus which dispenses with an offset adjustment.

A first aspect of this invention provides a clock signal generation apparatus comprising first means for extracting reference information from an input digital signal; an oscillator for generating a reference clock signal having a frequency depending on a control signal; second means connected to the first means and the oscillator for generating the control signal to the oscillator in response to the reference clock signal generated by the oscillator and the reference information extracted by the first means, and for locking a phase of the reference clock signal to the reference information; a memory; third means connected to the second means for deciding whether or not the phase of the reference clock signal is successfully locked to the reference information; fourth means connected to the second means, the memory, and the third means for storing the control signal generated by the second means into the memory when the third means decides that the phase of the reference clock signal is successfully locked to the reference information; and fifth means connected to the memory, the oscillator, and the second means for selecting one of the control signal currently generated by the second means and the control signal stored in the memory, and for feeding the selected control signal to the oscillator.

A second aspect of this invention is based on the first aspect thereof, and provides a clock signal generation apparatus wherein the fifth means comprises means for feeding the control signal currently generated by the second means to the oscillator when the input signal is equal to a received digital broadcasting signal, and means for feeding the stored control signal from the memory to the oscillator when the input signal is different from a received digital broadcasting signal.

A third aspect of this invention is based on the first aspect thereof, and provides a clock signal generation apparatus further comprising sixth means connected to the fourth means for inhibiting the fourth means from storing the control signal generated by the second means into the memory when an accuracy of the reference information is lower than a given accuracy.

A fourth aspect of this invention provides a clock signal generation apparatus comprising first means for extracting reference information from an input digital signal; a first oscillator for generating a reference clock signal having a frequency depending on a control signal; second means connected to the first means and the oscillator for generating a first error signal in response to the reference clock signal generated by the first oscillator and the reference information extracted by the first means; a second oscillator for generating a basic signal having a fixed frequency; third means connected to the first oscillator and the second oscillator for generating a second error signal in response to the reference clock signal generated by the first oscillator and the basic signal generated by the second oscillator; and fourth means connected to the oscillator, the second means, and the third means for selecting one of the first error signal generated by the second means and the second error signal generated by the third means, and for feeding the selected error signal to the oscillator as the control signal; wherein the reference clock signal is phase-locked to the reference information when the fourth means feeds the first error signal to the oscillator as the control signal, and the reference clock signal is phase-locked to the basic signal when the fourth means feeds the second error signal to the oscillator as the control signal.

DESCRIPTION OF THE PREFERRED EMBODIMENTS

A conceivable clock signal generation apparatus will be explained below for a better understanding of this invention.

Figure 1:
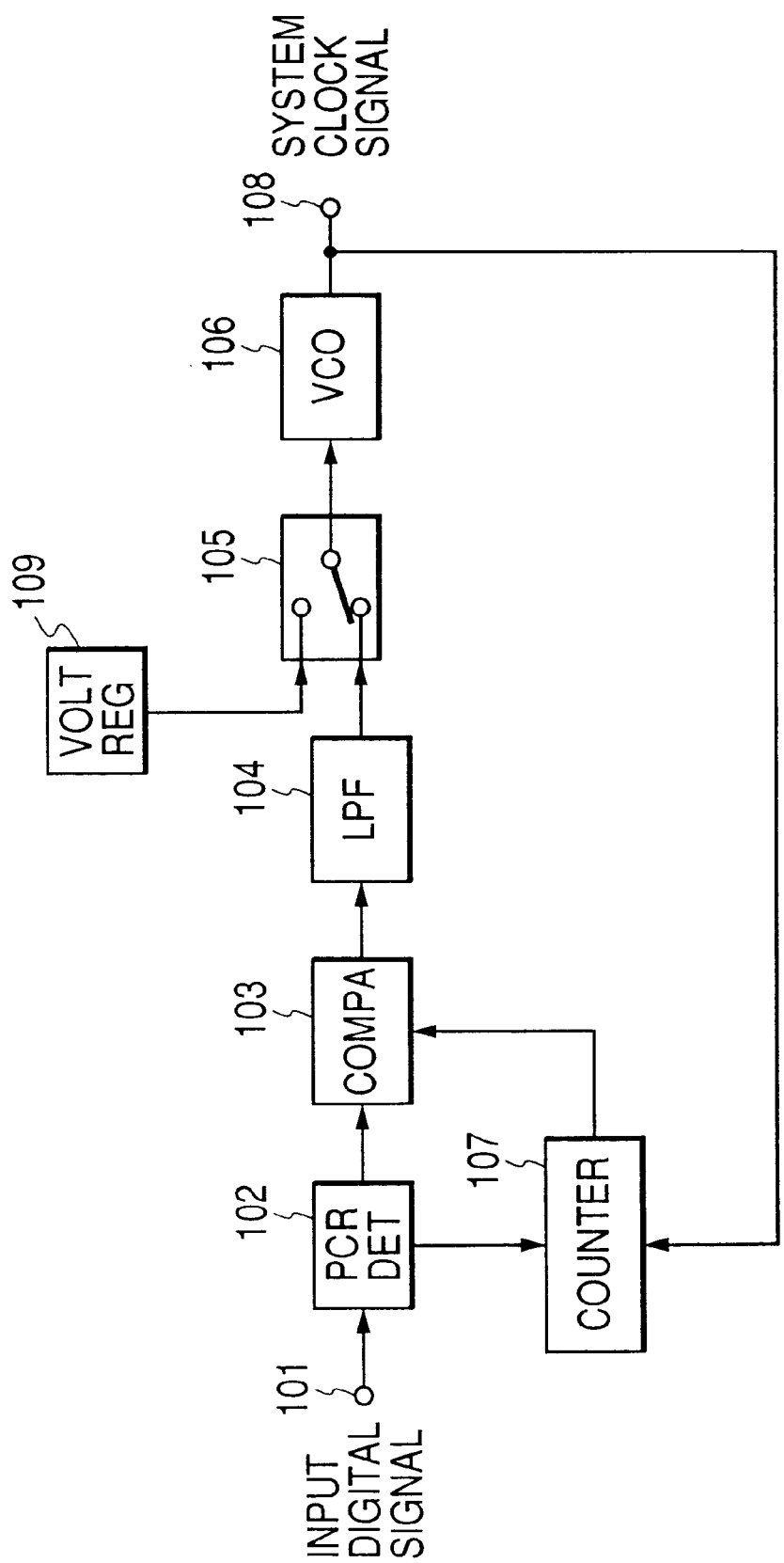
FIG. 1 is a block diagram of a conceivable clock signal generation apparatus.

FIG. 1 shows a conceivable clock signal generation apparatus provided in a receiver system for a digital broadcasting signal representing a plurality of programs. It should be noted that the conceivable apparatus of FIG. 1 is not prior art to this invention. The digital broadcasting signal has an MPEG2 transport stream of packets of video data and audio data. Here, MPEG2 is short for "Moving Picture Image Coding Experts Group Phase 2". For every program, the MPEG2 transport stream includes a periodically-occurring PCR (program clock reference) signal designed to enable the generation of a system clock signal.

The conceivable apparatus of FIG. 1 has a PLL (phase locked loop) circuit. Specifically, the conceivable apparatus of FIG. 1 includes a PCR detector 102 into which a received digital signal is inputted via an input terminal 101. The PCR detector 102 extracts a PCR signal from packets of the program of interest in the digital signal. The PCR detector 102 generates a control pulse at every standard time position determined by the extracted PCR signal. The conceivable apparatus of FIG. 1 includes a voltage-controlled oscillator (VCO) 106, and a counter 107 for counting pulses in the output signal of the VCO 106. The PCR detector 102 outputs the control pulse to the counter 107. The counter 107 latches a signal of the count value in response to every control pulse outputted from the PCR detector 102.

For example, the counter 107 has a counting circuit and a latch circuit. The counting circuit counts pulses in the output signal of the VCO 106. The counting circuit generates a signal representing the number of counted pulses which is referred to as the count-value signal. The latch circuit latches the count-value signal in response to the leading edge of every control pulse fed from the PCR detector 102. The counting circuit is reset in response to the trailing edge of every control pulse. The latched count-value signal represents the number of pulses in the output signal of the VCO 106 which occur during the time interval between two adjacent standard time positions determined by the extracted PCR signals. Thus, the latched count-value signal depends on the frequency of the output signal of the VCO 106.

In the conceivable apparatus of FIG. 1, the PCR detector 102 decodes the PCR signal into reference data representing a reference system clock signal frequency. The PCR detector 102 outputs the reference data to a first input terminal of a comparator 103. The counter 107 outputs the latched count-value signal to a second input terminal of the comparator 103. The device 103 compares the reference data and the latched count-value signal, generating a PWM (pulse width modulation) signal in response to the result of the comparison. The PWM signal depends on the error between the frequency of the output signal of the VCO 106 and the reference system clock signal frequency represented by the reference data. The comparator 103 outputs the PWM signal to a low pass filter (LPF) 104. The low pass filter 104 smooths the PWM signal. The smoothing-resultant signal can be transmitted from the low pass filter 104 to the VCO 106 via a switch 105 as a control voltage. The switch 105 connects the low pass filter 104 and the VCO 106 when the digital signal including the PCR signal is inputted into the apparatus. The VCO 106 generates a system clock signal (a reference clock signal) in response to the control voltage. The system clock signal has a frequency of 27 MHz. The system clock signal is transmitted from the VCO 106 to an external system (for example, a recording and reproducing system) via an output terminal 108. The VCO 106 outputs the system clock signal to the counter 107.

During the reception of digital broadcasting, the received digital signal is inputted into the PCR detector 102 via the input terminal 101, and the switch 105 continues to connect the low pass filter 104 and the VCO 106. In this case, the output signal of the VCO 106, that is, the system clock signal, is phase-locked to the PCR signal detected by the PCR detector 102.

During the non-reception of digital broadcasting, the switch 105 continues to disconnect the VCO 106 from the low pass filter 104 and to connect the VCO 106 with a voltage regulation circuit 109. In this case, a constant voltage is applied from the voltage regulation circuit 109 to the VCO 106 as a control voltage. To provide a short lock-up time of the PLL circuit upon a change from the non-reception of digital broadcasting to the reception thereof, it is desirable that the constant voltage applied to the VCO 106 is close to the voltage of the output signal of the low pass filter 104 which occurs when the output signal of the VCO 106 is phase-locked to the PCR signal.

In general, there are variations in characteristic among PLL circuits including VCO's 106. Accordingly, it is necessary to adjust an offset in a control voltage to the VCO 106 for each of the PLL circuits. The offset adjustment increases the manufacture cost of a receiver system.

First Embodiment

Figure 2:
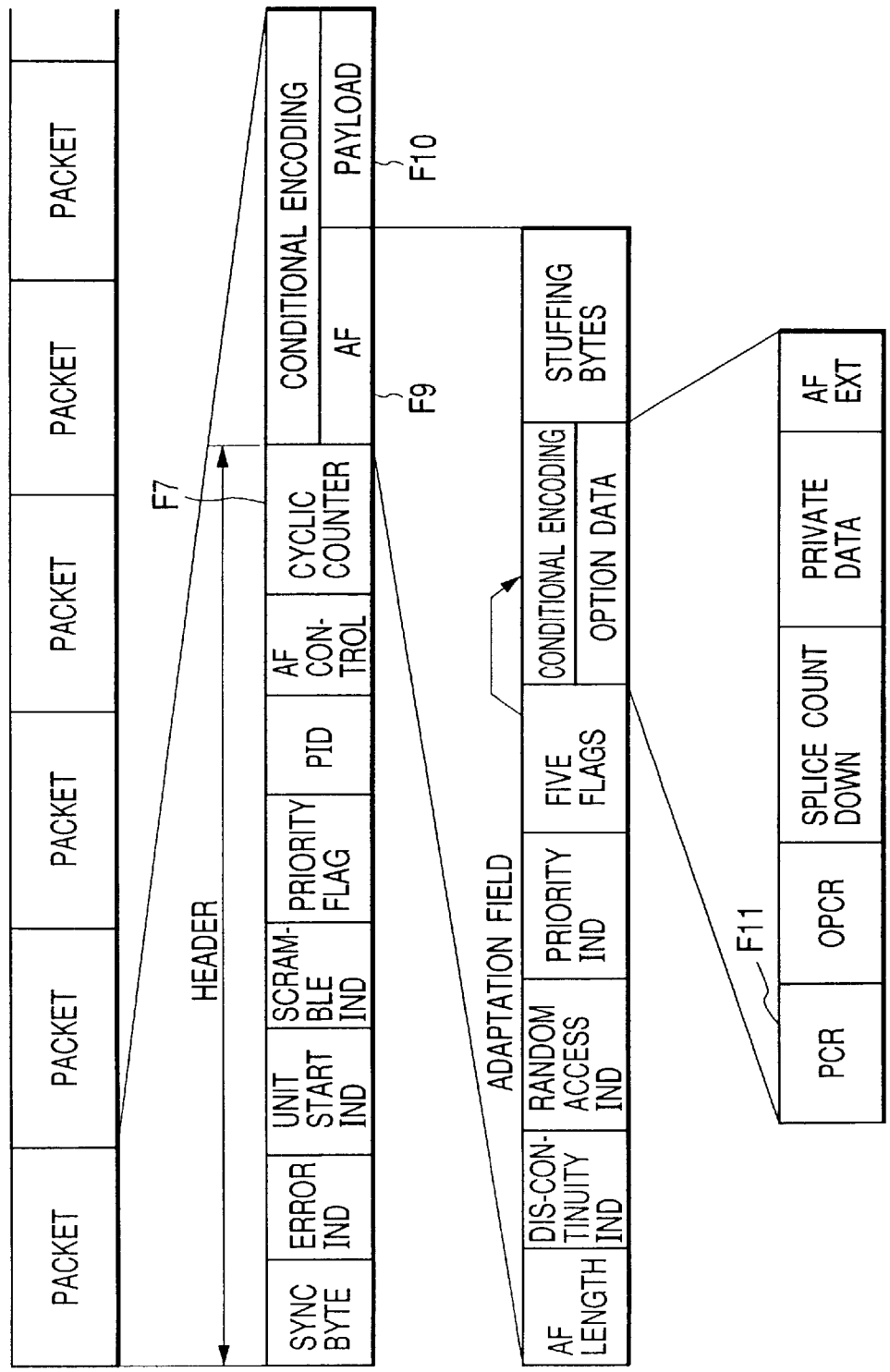
FIG. 2 is a diagram of the format of an MPEG2 transport stream.

As shown in FIG. 2, an MPEG2 transport stream is a sequence of transport packets each having 188 bytes. Each transport packet has a 4-byte (32-bit) header. The header includes a 2-bit adaptation field control segment F7 representing the presence or the absence of an adaptation field (AF) F9. When the adaptation field control segment F7 represents the absence of an adaptation field F9, the header is immediately followed by a normal-length payload F10. In general, video data or audio data is placed in the normal-length payload F10. When the adaptation field control segment F7 represents the presence of an adaptation field F9, the header is successively followed by the adaptation field F9 and a short-length payload F10. In general, video data, audio data, or stuffing data is placed in the short-length payload F10.

As shown in FIG. 2, the adaptation field (AF) F9 has a segment assigned to option data or conditional encoding information. This segment includes a 48-bit field F11 containing a PCR signal. The PCR signal in every field F11 has 42-bit effective data representing reference information (reference frequency information). A transport packet containing a PCR signal is repetitively transmitted at a period shorter than 0.1 second for each program. A predetermined time position (for example, a position of the head of a final byte) in a PCR signal is defined as a standard time position. In general, a system clock signal generated in a receiver side is corrected or calibrated in response to the reference information (the reference frequency information) represented by every PCR signal.

Figure 3:
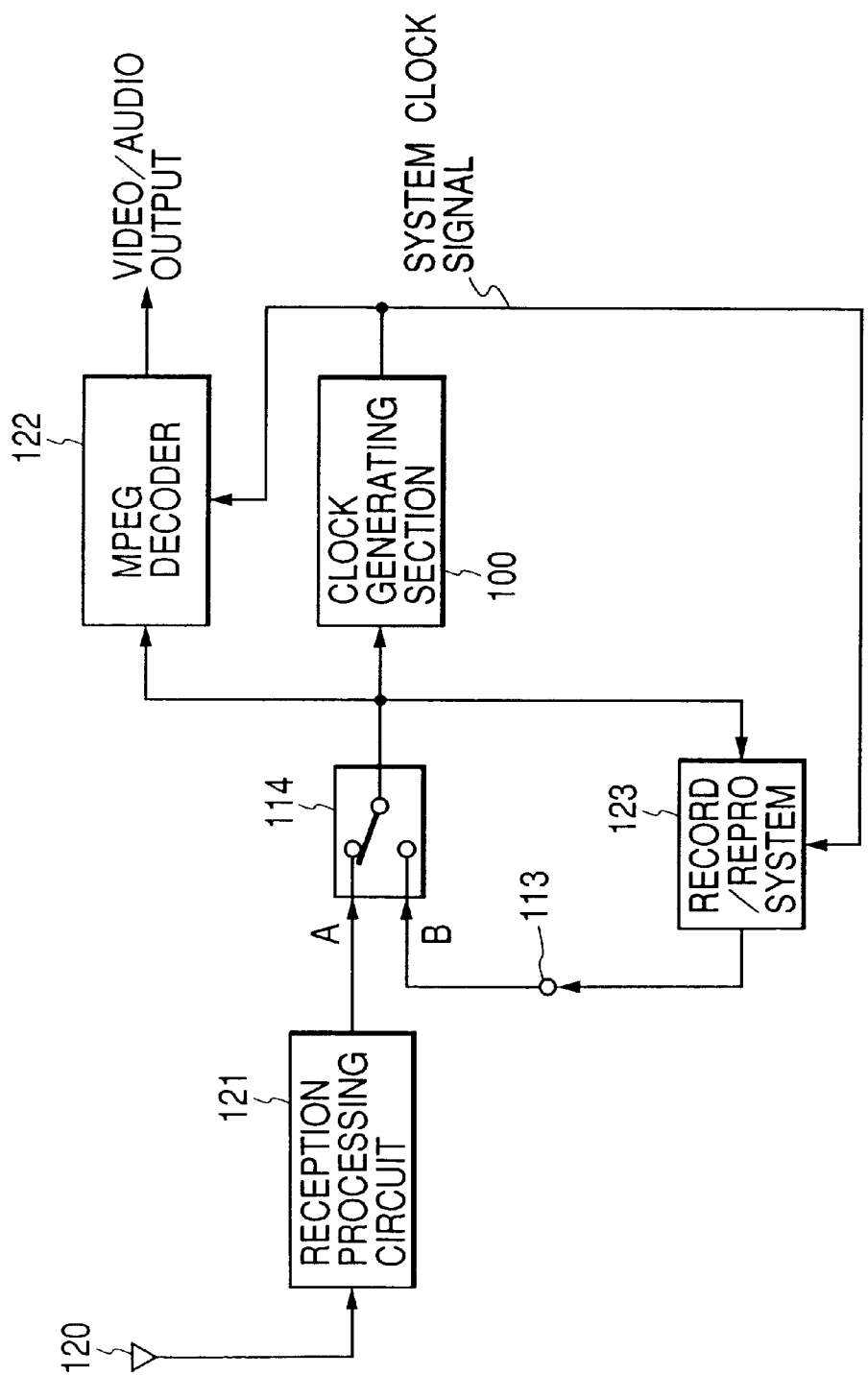
FIG. 3 is a block diagram of a receiver system including a clock signal generation apparatus according to a first embodiment of this invention.

FIG. 3 shows a receiver system including a clock signal generation apparatus according to a first embodiment of this invention. The receiver system in FIG. 3 is combined with a recording and reproducing system 123.

The receiver system in FIG. 3 includes a clock generating section 100, a switch 114, a reception processing circuit 121, and an MPEG decoder 122. The clock generating section 100 corresponds to the clock signal generation apparatus according to the first embodiment of this invention. As will be made clear later, the clock generating section 100 includes a PLL (phase locked loop) circuit. The switch 114 has a movable contact and two fixed contacts "A" and "B". The movable contact of the switch 114 is connected to either the fixed contact "A" thereof or the fixed contact "B" thereof. The reception processing circuit 121 is connected to an antenna 120. The reception processing circuit 121 is connected to the fixed contact "A" of the switch 114. The movable contact of the switch 114 is connected to the clock generating section 100 and the MPEG decoder 122. Also, the movable contact of the switch 114 is connected to an input side of the recording and reproducing system 123. The fixed contact "B" of the switch 114 is connected via an input terminal 113 to an output side of the recording and reproducing system 123. The clock generating section 100 is connected to the MPEG decoder 122 and the recording and reproducing system 123.

The antenna 120 catches a radio-frequency digital broadcasting signal. The antenna 120 feeds the radio-frequency digital broadcasting signal to the reception processing circuit 121. The reception processing circuit 121 subjects the radio-frequency digital broadcasting signal to various types of processing such as frequency conversion and error correction, thereby demodulating the radio-frequency digital broadcasting signal into a baseband digital broadcasting signal having an MPEG2 transport stream of packets. The baseband digital broadcasting signal is also referred to as the received digital broadcasting signal. The received digital broadcasting signal can be transmitted from the reception processing circuit 121 to the clock generating section 100, the MPEG decoder 122, and the recording and reproducing system 123 via the switch 114.

The recording and reproducing system 123 records and reproduces the digital broadcasting signal on and from a recording medium. The recording and reproducing system 123 uses, for example, a VTR (video tape recorder) conforming to the D-VHS standards. The reproduced digital broadcasting signal is transmitted from the recording and reproducing system 123 to the switch 114 via the input terminal 113.

The device 122 decodes the received digital broadcasting signal, that is, the MPEG2 transport stream, into a video signal and an audio signal. The MPEG decoder 122 outputs the video signal and the audio signal.

The clock generating section 100 produces a system clock signal (a reference clock signal) in response to the received digital broadcasting signal. The system clock signal has a frequency of 27 MHz. The clock generating section 100 feeds the system clock signal to the MPEG decoder 122 and the recording and reproducing system 123. The processing of the received digital broadcasting signal by the MPEG decoder 122 responds to the system clock signal. The signal processing for recording and reproducing the digital broadcasting signal by the recording and reproducing system 123 responds to the system clock signal.

Operation of the receiver system in FIG. 3 can be changed among different modes including a reception mode and a playback mode. During the reception mode of operation, that is, during the reception of a digital broadcasting signal, the movable contact of the switch 114 remains connected to the fixed contact "A" thereof so that the received digital broadcasting signal is transmitted from the reception processing circuit 121 to the clock generating section 100, the MPEG decoder 122, and the recording and reproducing system 123. During the playback mode of operation, the movable contact of the switch 114 remains connected to the fixed contact "B" thereof so that the reproduced digital broadcasting signal is transmitted from the recording and reproducing system 123 to the clock generating section 100 and the MPEG decoder 122.

Figure 4:
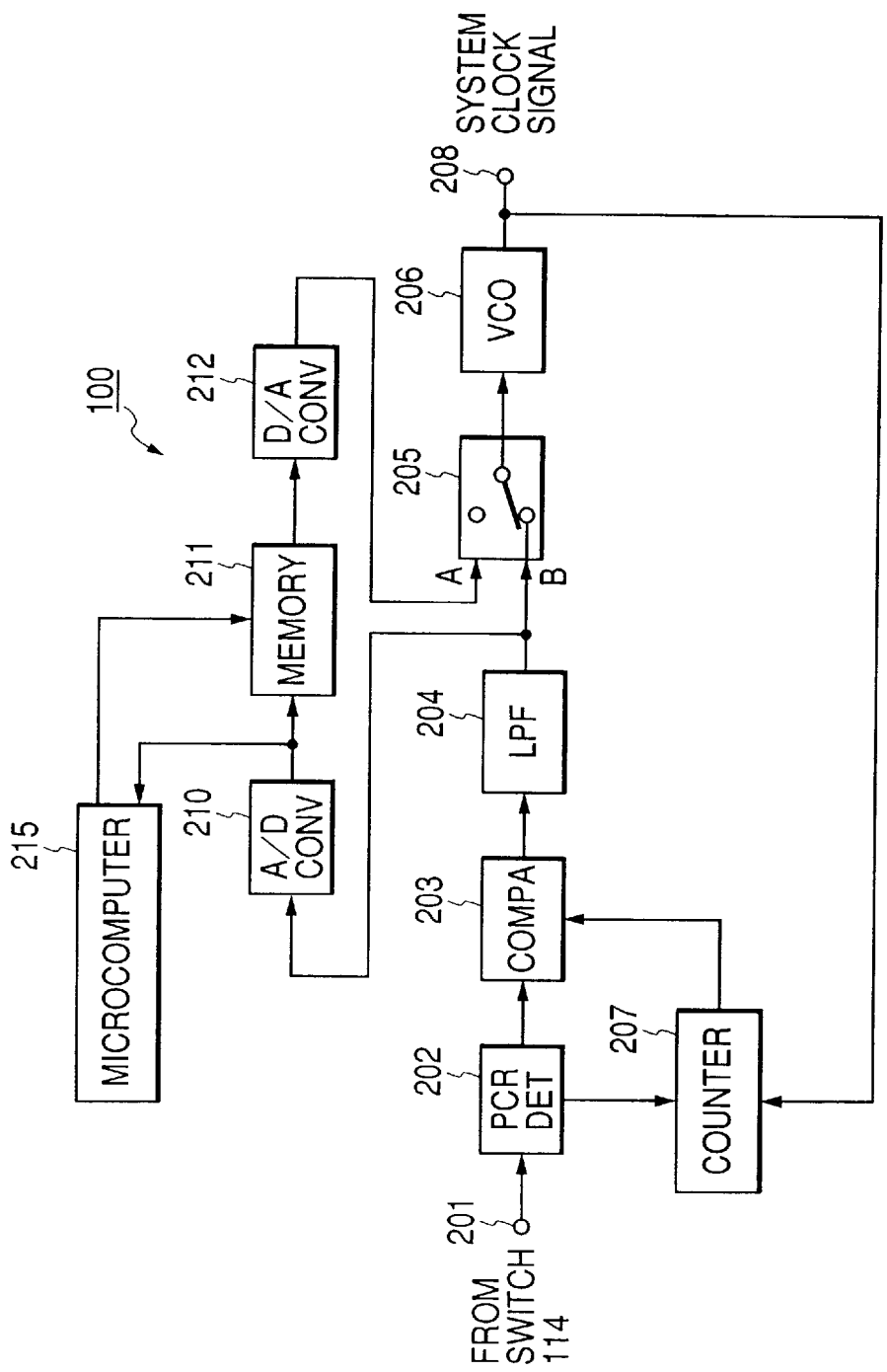
FIG. 4 is a block diagram of a clock generating section in FIG. 3.

As shown in FIG. 4, the clock generating section 100 includes an input terminal 201, a PCR detector 202, a comparator 203, a low pass filter (LPF) 204, a switch 205, a voltage-controlled oscillator (VCO) 206, a counter 207, an output terminal 208, an analog-to-digital (A/D) converter 210, a memory 211, a digital-to-analog (D/A) converter 212, and a microcomputer 215. The switch 205 has a movable contact and two fixed contacts "A" and "B". The movable contact of the switch 205 is connected to either the fixed contact "A" thereof or the fixed contact "B" thereof.

The PCR detector 202 is connected to the switch 114 (see FIG. 3) via the input terminal 201. The PCR detector 202 is connected to the comparator 203 and the counter 207. The comparator 203 is connected to the low pass filter 204 and the counter 207. The low pass filter 204 is connected to the fixed contact "B" of the switch 205. Also, the low pass filter 204 is connected to the A/D converter 210. The movable contact of the switch 205 is connected to the VCO 206. The VCO 206 is connected via the output terminal 208 to the MPEG decoder 122 and the recording and reproducing system 123 (see FIG. 3). Also, the VCO 206 is connected to the counter 207. The A/D converter 210 is successively followed by the memory 211 and the D/A converter 212. Also, the A/D converter 210 is connected to the microcomputer 215. The microcomputer 215 is connected to the memory 211. The D/A converter 212 is connected to the fixed contact "A" of the switch 205.

The PCR detector 202 is fed with the received digital broadcasting signal or the reproduced digital broadcasting signal via the input terminal 201. The PCR detector 202 extracts a PCR signal from packets of the program of interest in the received digital broadcasting signal or the reproduced digital broadcasting signal. The PCR detector 202 generates a control pulse at every standard time position determined by the extracted PCR signal. The counter 207 operates to count pulses in the output signal of the VCO 206. The PCR detector 202 outputs the control pulse to the counter 207. The counter 207 latches a signal of the count value in response to every control pulse outputted from the PCR detector 202.

For example, the counter 207 has a counting circuit and a latch circuit. The counting circuit counts pulses in the output signal of the VCO 206. The counting circuit generates a signal representing the number of counted pulses which is referred to as the count-value signal. The latch circuit latches the count-value signal in response to the leading edge of every control pulse fed from the PCR detector 202. The counting circuit is reset in response to the trailing edge of every control pulse. The latched count-value signal is fed from the counter 207 to the comparator 203. The latched count-value signal represents the number of pulses in the output signal of the VCO 206 which occur during the time interval between two adjacent standard time positions determined by the extracted PCR signals. Thus, the latched count-value signal depends on the frequency of the output signal of the VCO 206.

The PCR detector 202 decodes the PCR signal into reference data (reference information or reference frequency information) representing a reference system clock signal frequency. The PCR detector 202 outputs the reference data to a first input terminal of the comparator 203. The counter 207 outputs the latched count-value signal to a second input terminal of the comparator 203. The device 203 compares the reference data and the latched count-value signal, generating a PWM (pulse width modulation) signal in response to the result of the comparison. The PWM signal depends on the error between the frequency of the output signal of the VCO 206 and the reference system clock signal frequency represented by the reference data. The comparator 203 outputs the PWM signal to the low pass filter 204. The low pass filter 204 smooths the PWM signal. The low pass filter 204 outputs the smoothing-resultant signal to the fixed contact "B" of the switch 205. In addition, the low pass filter 204 outputs the smoothing-resultant signal to the A/D converter 210.

The A/D converter 210 changes the output signal of the low pass filter 204 into a corresponding digital signal. The A/D converter 210 outputs the resultant digital signal to the memory 211. The memory 211 can store the digital signal outputted from the A/D converter 210. The memory 211 periodically outputs the stored digital signal to the D/A converter 212. The D/A converter 212 changes the digital signal into a corresponding analog signal. The D/A converter 212 applies the resultant analog signal to the fixed contact "A" of the switch 205.

The switch 205 selects one of the output signal of the low pass filter 204 and the output signal of the D/A converter 212, and transmits the selected signal to the VCO 206 as a control voltage. The VCO 206 generates a system clock signal (a reference clock signal) in response to the control voltage. The system clock signal has a frequency of 27 MHz. The system clock signal is transmitted from the VCO 206 to the MPEG decoder 122 and the recording and reproducing system 123 (see FIG. 3) via the output terminal 208. The VCO 206 outputs the system clock signal to the counter 207.

In the case where the switch 205 connects the low pass filter 204 and the VCO 206, the devices 202–207 compose a PLL circuit which locks the phase of the system clock signal to the PCR signal detected by the PCR detector 202.

As shown in FIG. 4, the clock generating section 100 further includes the microcomputer 215 connected to the A/D converter 210 and the memory 211. The microcomputer 215 has a combination of an input/output circuit, a CPU, a ROM, and a RAM. The microcomputer 215 operates in accordance with a program stored in the ROM. The microcomputer 215 receives the output signal of the A/D converter 210.

During the reception of a digital broadcasting signal, that is, during the reception mode of operation of the receiver system in FIG. 3, the movable contact of the switch 114 is connected to the fixed contact "A" thereof, and the received digital broadcasting signal is inputted into the PCR detector 202 via the input terminal 201. In addition, the movable contact of the switch 205 continues to connect with the fixed contact "B" thereof. In this case, the output signal of the VCO 206, that is, the system clock signal, is phase-locked to the PCR signal detected by the PCR detector 202. The microcomputer 215 is programmed to periodically monitor the output signal of the A/D converter 210. Specifically, the microcomputer 215 periodically decides whether or not the rate of a variation in the output signal of the A/D converter 210 is less than a reference rate. This decision is to determine whether or not the system clock signal has fallen into a phase-locked state. When it is decided that the rate of the variation in the output signal of the A/D converter 210 is less than the reference rate, that is, when it is determined that the system clock signal has fallen into the phase-locked state, the microcomputer 215 enables the memory 211 to store the output signal of the A/D converter 210.

During the playback mode of operation of the receiver system in FIG. 3, the recording and reproducing system 123 reproduces the digital broadcasting signal from the recording medium, and the movable contact of the switch 114 is connected to the fixed contact "B" thereof so that the reproduced broadcasting signal is transmitted from the recording and reproducing system 123 to the clock generation section 100. Accordingly, the reproduced digital broadcasting signal is inputted into the PCR detector 202 via the input terminal 201. During the playback mode of operation of the receiver system in FIG. 3, the movable contact of the switch 205 initially connects with the fixed contact "B" thereof. In this case, under normal conditions, the output signal of the VCO 206 (that is, the system clock signal) is phase-locked to the PCR signal detected by the PCR detector 202. During the playback mode of operation of the receiver system in FIG. 3, the microcomputer 215 continues to inhibit the memory 211 from storing the output signal of the A/D converter 210.

The microcomputer 215 may be connected to the switch 205, and may be programmed to implement the following processes. During the playback mode of operation of the receiver system in FIG. 3, the microcomputer 215 periodically decides, on the basis of the output signal of the A/D converter 210, whether or not the system clock signal has successfully fallen into the phase-locked state in a predetermined time after the start of the playback mode of operation. In the case where it is decided that the system clock signal has not successfully fallen into the phase-locked state, that is, in the case where it is decided that the system clock signal has failed to fall into the phase-locked state, the microcomputer 215 disconnects the movable contact of the switch 205 from the fixed contact "B" thereof and connects the movable contact of the switch 205 to the fixed contact "A" thereof. In this case, the output signal of the D/A converter 212 is fed to the VCO 206 as a control voltage. Since the output signal of the D/A converter 212 originates from the digital signal in the memory 211 and hence corresponds to the control voltage to the VCO 206 which occurs during the previous reception mode of operation, the system clock signal generated by the VCO 206 can be stabilized.

It should be noted that the movable contact of the switch 205 may continue to connect with the fixed contact "A" thereof during the playback mode of operation of the receiver system in FIG. 3.

During a change from the playback mode of operation of the receiver system in FIG. 3 to the reception mode of operation thereof, it is preferable to initially connect the movable contact of the switch 205 to its fixed contact "A". In this case, the output signal of the D/A converter 212 is initially fed to the VCO 206 as a control voltage. Preferably, a given short time interval after the start of the reception mode of operation, the movable contact of the switch 205 is disconnected from the fixed contact "A" thereof and is connected to the fixed contact thereof "B". Accordingly, instead of the output signal of the D/A converter 212, the output signal of the low pass filter 204 is fed to the VCO 206 as a control voltage. As previously indicated, during an initial stage of the change from the playback mode of operation to the reception mode of operation, the output signal of the D/A converter 212 is fed to the VCO 206 as a control voltage. After the initial stage, the output signal of the low pass filter 204 is fed to the VCO 206 as a control voltage. Since the output signal of the D/A converter 212 originates from the digital signal in the memory 211 and hence corresponds to the control voltage to the VCO 206 which occurs during the previous reception mode of operation, the phase or the frequency of the system clock signal generated by the VCO 206 can be quickly locked up.

A digital signal different from a digital broadcasting signal may be fed to the switch 114 via the input terminal 113 in place of the reproduced digital broadcasting signal outputted from the recording and reproducing system 123. Such a digital signal comes from, for example, a digital interface. The movable contact of the switch 114 is connected to the fixed contact "B" thereof so that the digital signal is transmitted from the switch 114 to the clock generation section 100, the MPEG decoder 122, and the recording and reproducing system 123. In this case, the clock generation section 100 responds to the digital signal. It is preferable to inhibit the memory 211 from storing the output signal of the A/D converter 210 when a digital signal inputted into the clock generation section 100 differs from a digital broadcasting signal and has a PCR signal accuracy lower than a reference accuracy.

The first embodiment of this invention may be modified as follows. According to a first modification, the signal applied to the comparator 203 from the PCR detector 202 and the signal applied to the comparator 203 from the counter 207 are stored into memories during the stable and typical reception of digital broadcasting. In the first modification, during the non-reception of digital broadcasting, the stored signals continue to be fed from the memories to the comparator 203. According to a second modification, information of a given parameter such as a pulse width of the output signal of the comparator 203 is stored into a memory during the stable and typical reception of digital broadcasting. In the second modification, during the non-reception of digital broadcasting, the parameter information is read out from the memory, and a suitable signal to be fed to the low pass filter 204 is generated in response to the parameter information.

Second Embodiment

Figure 5:
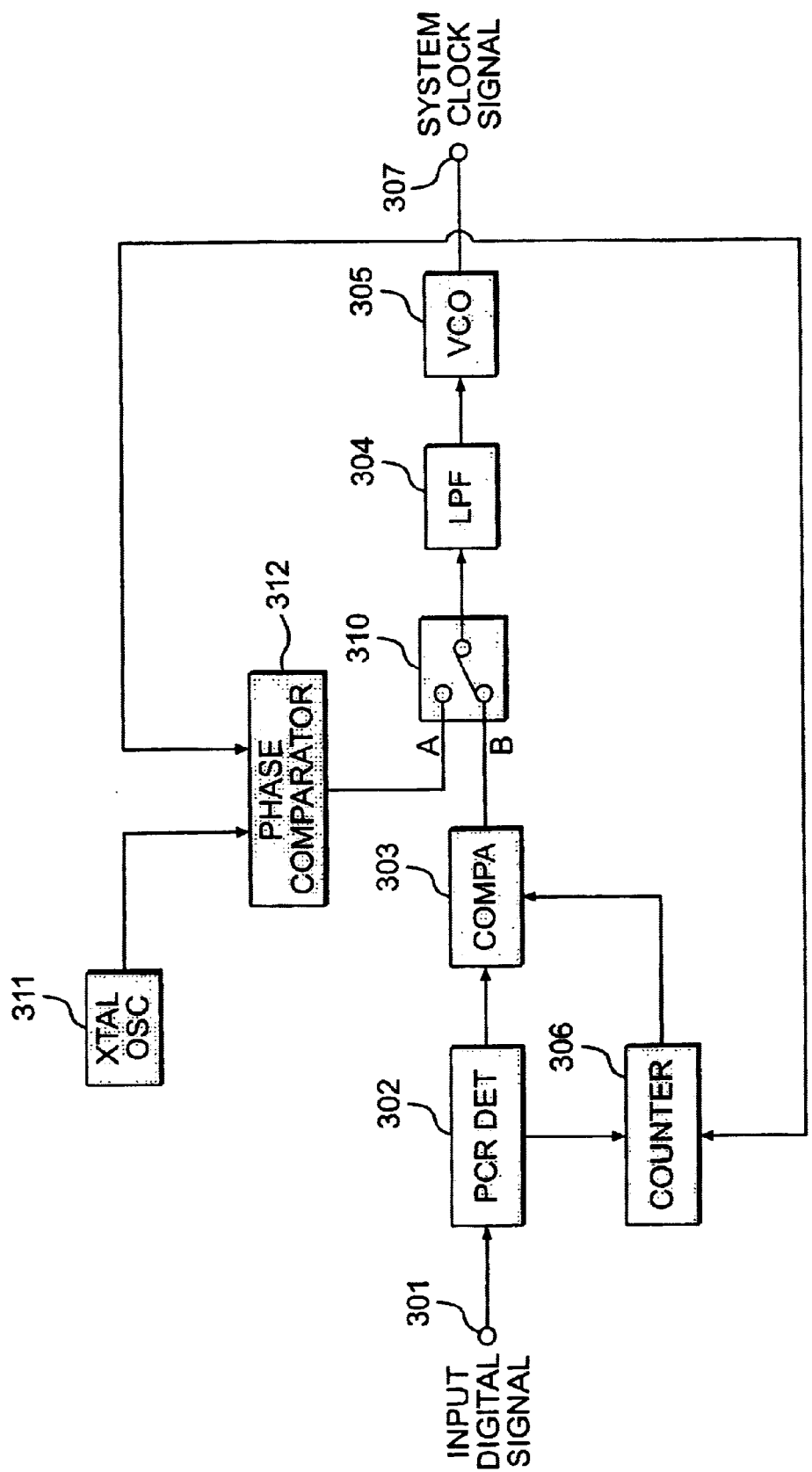
FIG. 5 is a block diagram of a clock signal generation apparatus according to a second embodiment of this invention.

FIG. 5 shows a clock signal generation apparatus according to a second embodiment of this invention. The clock signal generation apparatus of FIG. 5 can replace the clock generation section 100 in the receiver system of FIG. 3.

The clock signal generation apparatus of FIG. 5 includes an input terminal 301, a PCR detector 302, a comparator 303, a low pass filter (LPF) 304, a voltage-controlled oscillator (VCO) 305, a counter 306, an output terminal 307, a switch 310, a crystal oscillator 311, and a phase comparator 312. The switch 310 has a movable contact and two fixed contacts "A" and "B". The movable contact of the switch 310 is connected to either the fixed contact "A" thereof or the fixed contact "B" thereof.

The input terminal 301 is connected to the PCR detector 302. The PCR detector 302 is connected to the comparator 303 and the counter 306. The comparator 303 is connected to the fixed contact "B" of the switch 310. The movable contact of the switch 310 is connected to the low pass filter 304. The low pass filter 304 is connected to the VCO 305. The VCO 305 is connected to the counter 306, the output terminal 307, and the phase comparator 312. The crystal oscillator 311 is connected to the phase comparator 312. The phase comparator 312 is connected to the fixed contact "A" of the switch 310.

The PCR detector 302 is fed with a received digital broadcasting signal via the input terminal 301. The PCR detector 302 extracts a PCR signal from packets of the program of interest in the received digital broadcasting signal. The PCR detector 302 generates a control pulse at every standard time position determined by the extracted PCR signal. The counter 306 operates to count pulses in the output signal of the VCO 305. The PCR detector 302 outputs the control pulse to the counter 306. The counter 306 latches a signal of the count value in response to every control pulse outputted from the PCR detector 302.

For example, the counter 306 has a counting circuit and a latch circuit. The counting circuit counts pulses in the output signal of the VCO 305. The counting circuit generates a signal representing the number of counted pulses which is referred to as the count-value signal. The latch circuit latches the count-value signal in response to the leading edge of every control pulse fed from the PCR detector 302. The counting circuit is reset in response to the trailing edge of every control pulse. The latched count-value signal is fed from the counter 306 to the comparator 303. The latched count-value signal represents the number of pulses in the output signal of the VCO 305 which occur during the time interval between two adjacent standard time positions determined by the extracted PCR signals. Thus, the latched count-value signal depends on the frequency of the output signal of the VCO 305.

The PCR detector 302 decodes the PCR signal into reference data (reference information or reference frequency information) representing a reference system clock signal frequency. The PCR detector 302 outputs the reference data to a first input terminal of the comparator 303. The counter 306 outputs the latched count-value signal to a second input terminal of the comparator 303. The device 303 compares the reference data and the latched count-value signal, generating a PWM (pulse width modulation) signal in response to the result of the comparison. The PWM signal depends on the error between the frequency of the output signal of the VCO 305 and the reference system clock signal frequency represented by the reference data. The comparator 303 outputs the PWM signal to the fixed contact "B" of the switch 310.

The crystal oscillator 311 generates an internal reference signal having a frequency of 27 MHz. The crystal oscillator 311 outputs the internal reference signal to a first input terminal of the phase comparator 312. A second input terminal of the phase comparator 312 is subjected to the output signal of the VCO 305. The device 312 compares the phase of the output signal of the VCO 305 and the phase of the internal reference signal, generating a voltage signal representing the error between the phase of the output signal of the VCO 305 and the phase of the internal reference signal. The phase comparator 312 outputs the error signal to the fixed contact "A" of the switch 310.

The switch 310 selects one of the output signal of the comparator 303 and the output signal of the phase comparator 312, and transmits the selected signal to the low pass filter 304. The low pass filter 304 smooths the signal selected by the switch 310. The low pass filter 304 outputs the smoothing-resultant signal to the VCO 305 as a control voltage. The VCO 305 generates a system clock signal (a reference clock signal) in response to the control voltage. The system clock signal has a frequency of 27 MHz. The system clock signal is transmitted from the VCO 305 to an external system and an external device via the output terminal 307. The VCO 305 outputs the system clock signal to the counter 306 and the phase comparator 312.

In the case where the switch 310 connects the comparator 303 and the low pass filter 304, the devices 302–306 compose a PLL circuit which locks the phase of the system clock signal to the PCR signal detected by the PCR detector 302. In the case where the switch 310 connects the low pass filter 304 and the phase comparator 312, the devices 304, 305, and 312 compose a PLL circuit which locks the phase of the system clock signal to the internal reference signal generated by the crystal oscillator 311.

An explanation will be given of the case where the clock signal generation apparatus of FIG. 5 replaces the clock generation section 100 in the receiver system of FIG. 3. The state of the switch 310 changes when the operation of the receiver system changes between the reception mode and the playback mode.

During the reception of a digital broadcasting signal, that is, during the reception mode of operation of the receiver system, the received digital broadcasting signal is inputted into the PCR detector 302 via the input terminal 301, and the movable contact of the switch 310 continues to connect with the fixed contact "B" thereof. In this case, the switch 310 connects the comparator 303 and the low pass filter 304, and the output signal of the VCO 305, that is, the system clock signal, is phase-locked to the PCR signal detected by the PCR detector 302.

During the playback mode of operation of the receiver system, the movable contact of the switch 310 continues to connect with the fixed contact "A" thereof. In this case, the switch 310 connects the low pass filter 304 and the phase comparator 312, and the output signal of the VCO 305, that is, the system clock signal, is phase-locked to the internal reference signal generated by the crystal oscillator 311.

What is claimed is:

1. A clock signal generation apparatus comprising:

a receiving portion for receiving a broadcast signal containing reference information;

a recording and reproducing portion for recording the broadcast signal received by the receiving portion, and for reproducing the recorded broadcast signal;

means for extracting the reference information from the broadcast signal received by the receiving portion;

a first oscillator for generating a reference clock signal having a frequency depending on a control signal;

a second oscillator for generating a basic signal having a fixed frequency and being independent of said reference information;

a first circuit loop for generating a first error signal in response to the reference clock signal generated by the first oscillator and the reference information extracted by the extracting means, and for feeding the first error signal back to the first oscillator as the control signal during the reception of the broadcast signal by the receiving portion; and a second circuit loop for generating a second error signal in response to the reference clock signal generated by the first oscillator and the basic signal generated by the second oscillator, and for feeding the second error signal back to the first oscillator as the control signal during the reproduction of the broadcast signal by the recording and reproducing portion.

2. A clock signal generation apparatus as recited in claim 1, wherein the first circuit loop and the second circuit loop comprise a common low pass filter immediately preceding the first oscillator.

3. A clock signal generation apparatus comprising:

a receiving portion for receiving a broadcast signal containing reference information;

a recording and reproducing portion for recording the broadcast signal received by the receiving portion and for reproducing the recorded broadcast signal;

first means for extracting the reference information from the broadcast signal received by the receiving portion;

a first oscillator for generating a reference clock signal having a frequency depending on an input control signal;

a second oscillator for generating a basic signal having a fixed frequency and being independent of the reference information, second means for generating a first control signal in response to the reference clock signal generated by the first oscillator and the reference information extracted by the first means;

third means for generating a second control signal in response to the reference clock signal generated by the first oscillator and the basic signal generated by the second oscillator; and fourth means for selecting one of (1) the first control signal generated by the second means and (2) the second control signal generated by the third means, and for feeding the selected control signal to the first oscillator as the input control signal;

wherein the fourth means comprises means for selecting the first control signal and feeding the first control signal to the first oscillator as the input control signal during the reception of the broadcast signal by the receiving portion, and means for selecting the second control signal and feeding the second control signal to the first oscillator as the input control signal during the reproduction of the broadcast signal by the recording and reproducing portion.

4. A clock signal generation apparatus as recited in claim 3, wherein the fourth means comprises a low pass filter for filtering the selected control signal.

5. A clock signal generation apparatus comprising:

a receiving portion for receiving a broadcast signal containing reference information;

a recording and reproducing portion for recording the broadcast signal received by the receiving portions, and for reproducing the recorded broadcast signal;

a first means for extracting reference information from the broadcast signal received by the receiving portion;

a first oscillator for generating a reference clock signal having a frequency depending on a control signal;

a second oscillator for generating a basic signal having a fixed frequency;

a first circuit loop for generating a first error signal in response to the reference clock signal generated by the first oscillator and the reference information extracted by the first means, and for feeding the first error signal back to the first oscillator as the control signal;

a second circuit loop for generating a second error signal in response to the reference clock signal generated by the first oscillator and the basic signal generated by the second oscillator, and for feeding the second error signal back to the first oscillator as the control signal; and second means for enabling the first circuit loop and disabling the second circuit loop during the reception of the broadcast signal by the receiving portion, and enabling the second circuit loop and disabling the first circuit loop during the reproduction of the broadcast signal by the recording sad reproducing portion.

6. A clock signal generation apparatus as recited in claim 5, wherein the first circuit loop and the second circuit loop comprise a common low pass filter immediately preceding the first oscillator.

* * * * *